(12) United States Patent
Dai

(10) Patent No.: US 9,040,368 B1
(45) Date of Patent: May 26, 2015

(54) THIN FILM TRANSISTOR AND METHOD OF MAKING THE SAME

(71) Applicant: SHENZHEN CHINA STAR OPTOELECTRONICS TECHNOLOGY CO., LTD., Shenzhen (CN)

(72) Inventor: Tianming Dai, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/375,911

(22) PCT Filed: May 14, 2014

(86) PCT No.: PCT/CN2014/077412
§ 371 (c)(1),
(2) Date: Jul. 31, 2014

(30) Foreign Application Priority Data

Apr. 11, 2014 (CN) .......................... 2014 1 0143831

(51) Int. Cl.
H01L 29/45 (2006.01)
H01L 29/66 (2006.01)
H01L 21/768 (2006.01)
H01L 29/49 (2006.01)
H01L 21/04 (2006.01)
H01L 27/12 (2006.01)

(52) U.S. Cl.
CPC .... *H01L 29/66757* (2013.01); *H01L 21/76802* (2013.01); *H01L 29/4908* (2013.01); *H01L 21/0485* (2013.01); *H01L 27/1274* (2013.01); *H01L 29/458* (2013.01)

(58) Field of Classification Search
CPC ... H01L 21/048; H01L 27/1274; H01L 29/40; H01L 29/66007
See application file for complete search history.

(56) References Cited

U.S. PATENT DOCUMENTS

2007/0108472 A1* 5/2007 Jeong et al. ................... 257/192

* cited by examiner

*Primary Examiner* — Cheung Lee
(74) *Attorney, Agent, or Firm* — Ladas & Parry LLP

(57) ABSTRACT

A method for fabricating a thin film transistor has the steps of: sequentially forming a buffer layer and a poly-silicon layer; forming a gate insulating layer on the poly-silicon layer, and etching the gate insulating layer to expose the poly-silicon layer needed for an ohmic contact; forming an ohmic contact layer on the gate insulating layer and the poly-silicon layer, and etching an extra portion of the ohmic contact layer to reserve the ohmic contact layer contacted with the poly-silicon layer; forming a gate electrode on the gate insulating layer; forming a dielectric layer on the gate electrode and the gate insulating layer, as well as forming through holes; and forming a source electrode and a drain electrode on the through hole.

10 Claims, 9 Drawing Sheets

THIN FILM TRANSISTOR AND METHOD OF MAKING THE SAME

FIELD OF THE INVENTION

The present invention relates to a method for fabricating a thin film transistor, in particular, it relates to an improved method for fabricating a thin film transistor that can solve the problems of over etching to a poly-silicon layer, or insufficient etching of an ohmic contact layer.

BACKGROUND OF THE INVENTION

Amorphous-silicon thin film transistors (a-Si TFTs) have been widely used in the display device, for the amorphous-silicon thin film transistors, by using a low-temperature poly-silicon (LTPS) design as the driving assembly can better meet the needs of high-performance and high-resolution for display device in nowadays. At present, in the LTPS process, a channel is usually doped by ion implantation, so as to adjust the threshold voltage, or by using a dopant to reduce the resistance of source electrode/drain electrode. However, with the development of large-size display, the LTPS process, besides its poor uniformity to a large area, the ion implantation can only be currently used in small-size displays. Today, the LTPS technology is sophisticated, the uniformity problem of the thin film is improved, followed by, is how to achieve a source electrode/drain electrode region with low-resistance without using the ion implantation, that is to say, how to define an ohmic contact layer at both ends of the transistor channel, in other words, a non-implant LTPS technology.

FIG. 1 is a flowchart of a method for fabricating a conventional thin film transistor. FIG. 2A~FIG. 2G are schematic diagrams of a conventional thin film transistor. The flowchart of FIG. 1 is described below, along with FIG. 2A~FIG. 2G. In step S102 of FIG. 2A, a buffer layer 204 and an amorphous-silicon (a-Si) layer 206 are sequentially disposed on a substrate 202. Next, in step S104 of FIG. 2B, a poly-silicon layer 208 is formed and patterned to define a semiconductor region.

Generally, after the amorphous-silicon layer 206 is formed, the amorphous-silicon layer 206 is converted to the poly-silicon layer 208 having a polycrystalline structure by a low temperature crystallization process. In step S106 of FIG. 2C, an ohmic contact layer 210 is formed on the poly-silicon layer 208 and patterned to define a channel region 212, further the ohmic contact layer 210 of the channel region 212 is etched by a dry etching manner.

A $N^+$ or a $P^+$ layer is being grown on the poly-silicon as the ohmic contact layer 210 by chemical vapor deposition, the thickness of the ohmic contact layer is generally between 400-800 Å, after that, the channel region 212 is defined by using a mask, and then the ohmic contact layer 210 of the channel region is etched. However, in this step, the uniformity issue of the dry etching manner will cause a partial region of the ohmic contact layer 210 insufficient etched, and some regions are over etched to the poly-silicon layer 208, so that the thickness of the poly-silicon layer 208 is reduced, causing the electrical uniformity of the thin film of the LCD panel performing poor, thus making the panel mura a more serious problem.

Next, in step S108 of FIG. 2D, a gate insulating layer 214 is formed on the ohmic contact layer 210 and the poly-silicon layer 208, so that the gate insulating layer 214 covers the channel region 212 and the ohmic contact layer 210. In step S110 2E of FIG. 2E, a gate electrode 216 is formed on the gate insulating layer 214. In step S112 of FIG. 2F, a dielectric layer 218 is formed on the gate electrode 216 and the gate insulating layer 214, as well as formed through holes 220. The through holes 220 are located on two sides of the gate electrode 216, respectively, and pass through the dielectric layer 218 and the gate insulating layer 214 to expose the ohmic contact layer 210. Finally, in step S114 of FIG. 2G, a source electrode and a drain electrode 222 are formed on the through holes 220.

As described above, the non-implant LTPS technology needs to improve the uneven thickness problems of the poly-silicon layer 208 caused by the dry etching of the ohmic contact layer 210. Generally, the ohmic contact layer is deposited after the poly-silicon layer 208 is formed, after the channel region 212 is defined by using the mask, and the ohmic contact layer 210 of the channel region 212 is etched by the dry etching manner, only contact regions of the source electrode and the drain electrode are left. Since the thickness of the ohmic contact layer 210 is generally thin, which is between 300 Å-800 Å, the thickness of the poly-silicon layer 208 is around 400 Å-800 Å. Therefore, in the etching process of the ohmic contact layer 210, an over etched to the poly-silicon layer 208 is inevitable.

In addition, due to the uniformity problems of etching machine, some areas are more etched, while some areas are less etched, the more etched areas are likely to cause electrical changes of the thin film transistor, and the less etched areas will increase electricity leakage, and seriously cause a short circuit.

Thus, a novel method for fabricating a thin film transistor is needed, through altering the manufacturing processes, and breaking the limitation of the channel region, so as to improve the over etching to the poly-silicon layer or the insufficient etching of the ohmic contact layer when etching the ohmic contact layer, and overcome the etching uniformity and accuracy problems caused by etching the ohmic contact layer.

SUMMARY OF THE INVENTION

An object of the present invention is to eliminate that during the process of etching the ohmic contact layer, because of the etching uniformity and accuracy, over etching to the poly-silicon layer of the channel region or insufficient etching of the ohmic contact layer which caused a short circuit can be improved.

To solve the above problem, a method for fabricating a thin film transistor is constructed in the present invention, the method comprises the steps of: sequentially forming a buffer layer and a poly-silicon layer; forming a gate insulating layer on the poly-silicon layer, and etching the gate insulating layer to expose the poly-silicon layer needed for an ohmic contact; forming an ohmic contact layer on the gate insulating layer and on the poly-silicon layer, and etching the extra portion of the ohmic contact layer to reserve the ohmic contact layer contacted with the poly-silicon layer; forming a gate electrode on the gate insulating layer; forming a dielectric layer on the gate electrode and on the gate insulating layer, as well as forming a through hole; and forming a source electrode and a drain electrode on the through hole.

In one embodiment of the present invention, in the step of sequentially forming a buffer layer and a poly-silicon layer, the buffer layer and an amorphous-silicon layer are sequentially deposited, and then the amorphous-silicon layer is converted to the poly-silicon layer.

In one embodiment of the present invention, in the step of convert the amorphous-silicon layer to the poly-silicon layer is using either a laser annealing or a metal solid phase crystallization to convert the amorphous-silicon layer to the poly-silicon layer having a poly-silicon structure.

In one embodiment of the present invention, in the step of etching an extra portion of the ohmic contact layer to reserve the ohmic contact layer contacted with the poly-silicon layer, a channel region is first defined on the gate insulating layer, the channel region of the gate insulating layer is etched to expose the poly-silicon layer needed for the ohmic contact.

In one embodiment of the invention, in the step of forming a gate insulating layer on the poly-silicon layer, the material of the gate insulating layer are silicon nitride (SiNx) and silicon oxide (SiOx), the silicon nitride of the gate insulating layer is etched by a dry etching manner, and then the silicon oxide of the gate insulating layer is etched by a wet etching manner.

In one embodiment of the invention, in the step of the silicon oxide of the gate insulating layer is etched by a wet etching manner, an etching solution of the wet etching manner is selected from the group composed of hydrogen fluoride and ammonium fluoride.

Another object of the present invention is to improve the uniformity and accuracy problems caused by etching the ohmic contact layer.

To solve the above problem, a method for fabricating a thin film transistor is constructed in the present invention, the method comprises the steps of: sequentially forming a buffer layer and an amorphous-silicon layer; converting the amorphous-silicon layer to a poly-silicon layer by a low temperature crystallization process; forming a gate insulating layer having a silicon nitride and silicon oxide on the poly-silicon layer, a channel region is defined on the gate insulating layer, and the channel region of the gate insulating layer is etched to expose the poly-silicon layer needed for an ohmic contact; simultaneously depositing an ohmic contact layer and a gate electrode metal layer on the gate insulating layer and on the poly-silicon layer, and etching an extra region of the ohmic contact layer and the gate electrode metal layer to reserve the ohmic contact layer; forming a gate electrode on the gate insulating layer; forming a dielectric layer on the gate electrode and on the gate insulating layer, as well as forming a through hole; and forming a source electrode and a drain electrode on the through hole.

In one embodiment of the present invention, in the step of converting the amorphous-silicon layer to the poly-silicon layer is using either a laser annealing or a metal solid-phase crystallization to convert the amorphous-silicon layer to the poly-silicon layer having a poly-silicon structure.

In one embodiment of the present invention, in the step of forming a gate insulating layer having the silicon nitride and the silicon oxide on the poly-silicon layer, the gate insulating layer having the silicon nitride is first etched by a dry etching manner, and then the gate insulating layer having the silicon oxide is etched by a wet etching manner.

In one embodiment of the invention, in the step of a the gate insulating layer having the silicon oxide is etched by a wet etching manner, an etching solution of the wet etching manner is selected from the group composed of hydrogen fluoride and ammonium fluoride.

The beneficial effect of the present invention is: to eliminate the short circuit problem caused by over etching to the poly-silicon layer of the channel region or the accumulation of the ohmic contact layer due to the etching uniformity and accuracy during the process of etching the ohmic contact layer.

For a better understanding of the aforementioned content of the present invention, preferable embodiments are illustrated in accordance with the attached figures as follows:

DETAILED DESCRIPTION OF THE PREFERRED EMBODIMENTS

Figure 1:
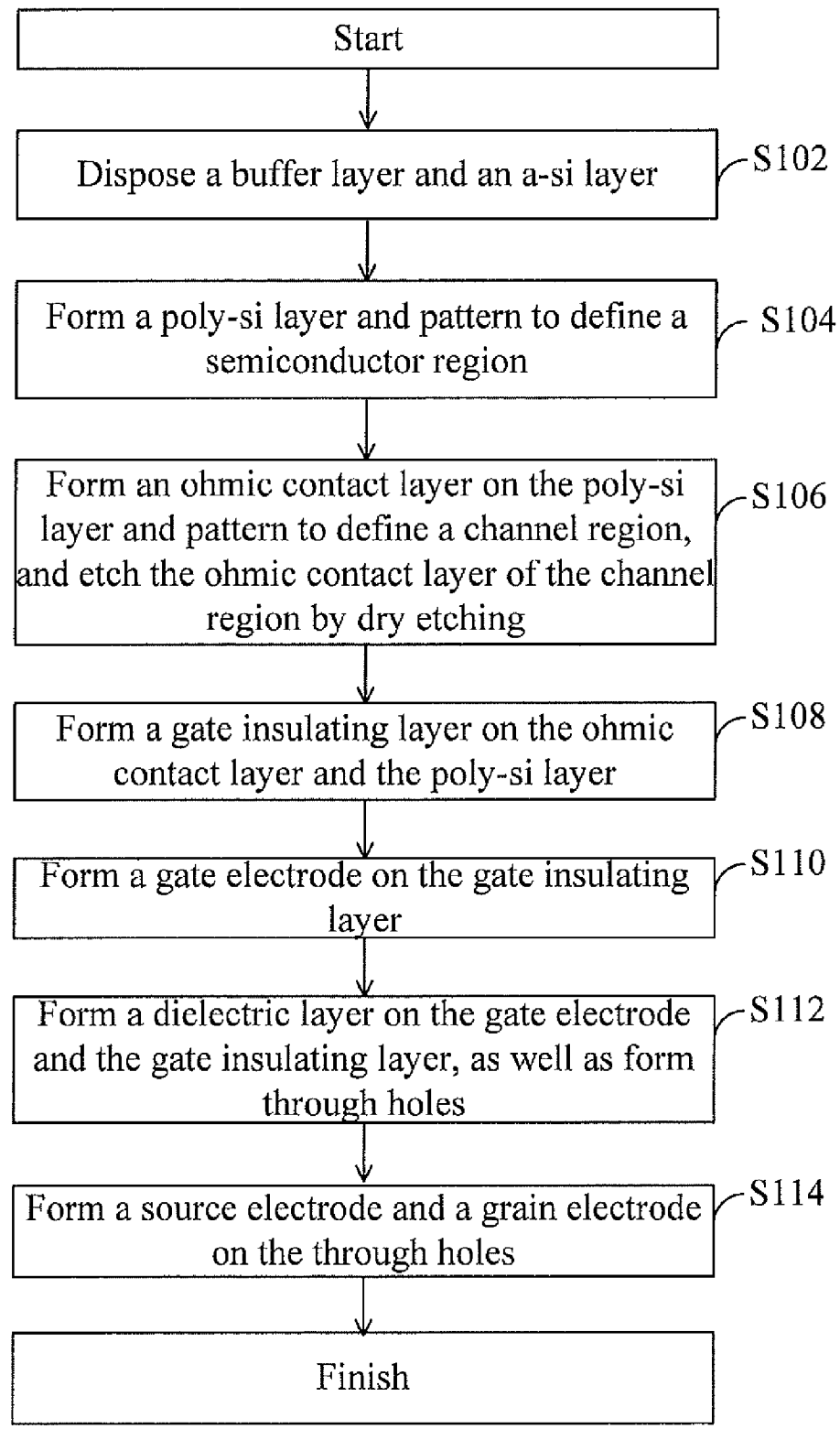
FIG. 1 is a flowchart of a method for fabricating a conventional thin film transistor.
Figure 2A:
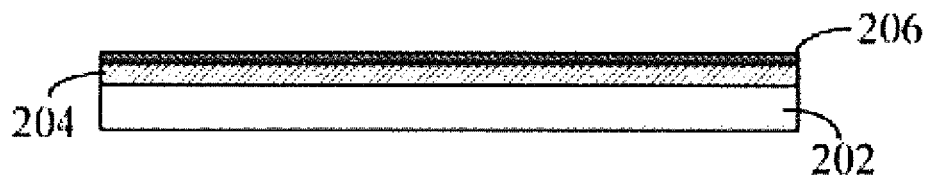
FIG. 2A~2G are schematic diagrams of conventional thin film transistors.
Figure 2B:
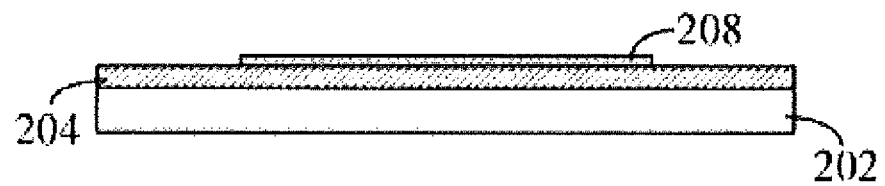
Figure 2C:
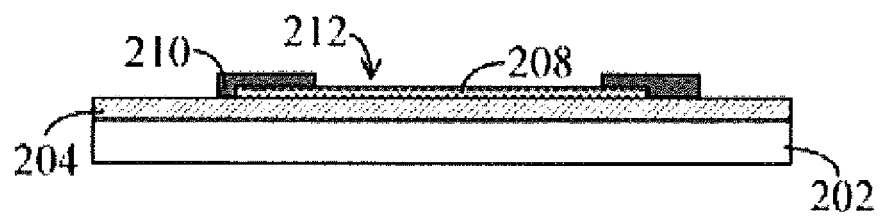
Figure 2D:
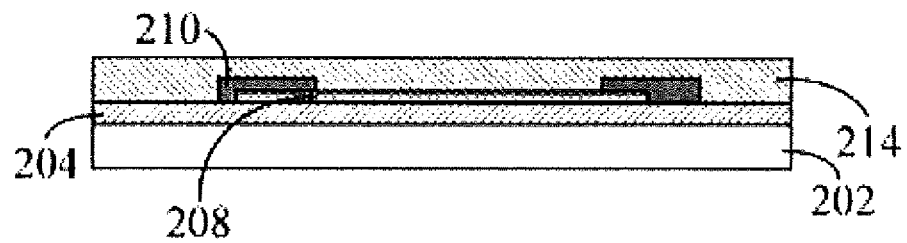
Figure 2E:
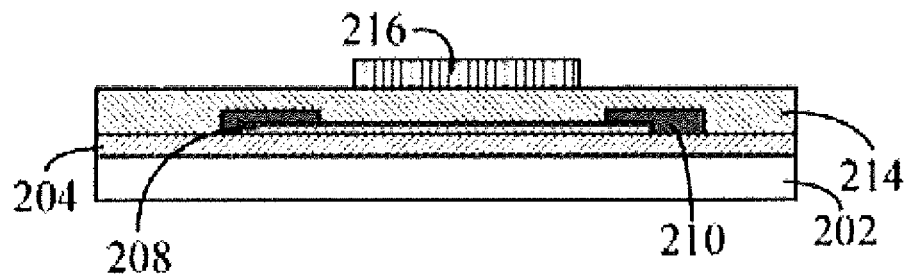
Figure 2F:
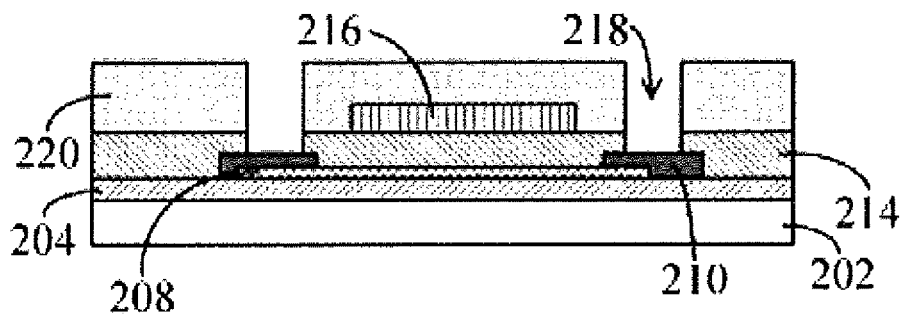
Figure 2G:
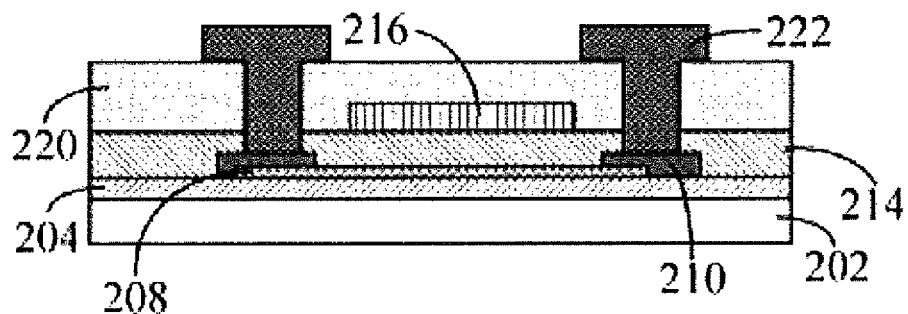

The following descriptions of the respective embodiments are specific embodiments capable of being implemented as illustrations of the present invention, with reference to the appended figures. The terms up, down, front, rear, left, right, interior, exterior, side, etcetera are merely directions referring to the appended figures. Therefore, such directions are employed for explaining and understanding the present invention, but are not limitations thereto. In the drawings, similar structures are represented by the same symbols.

Figure 3:
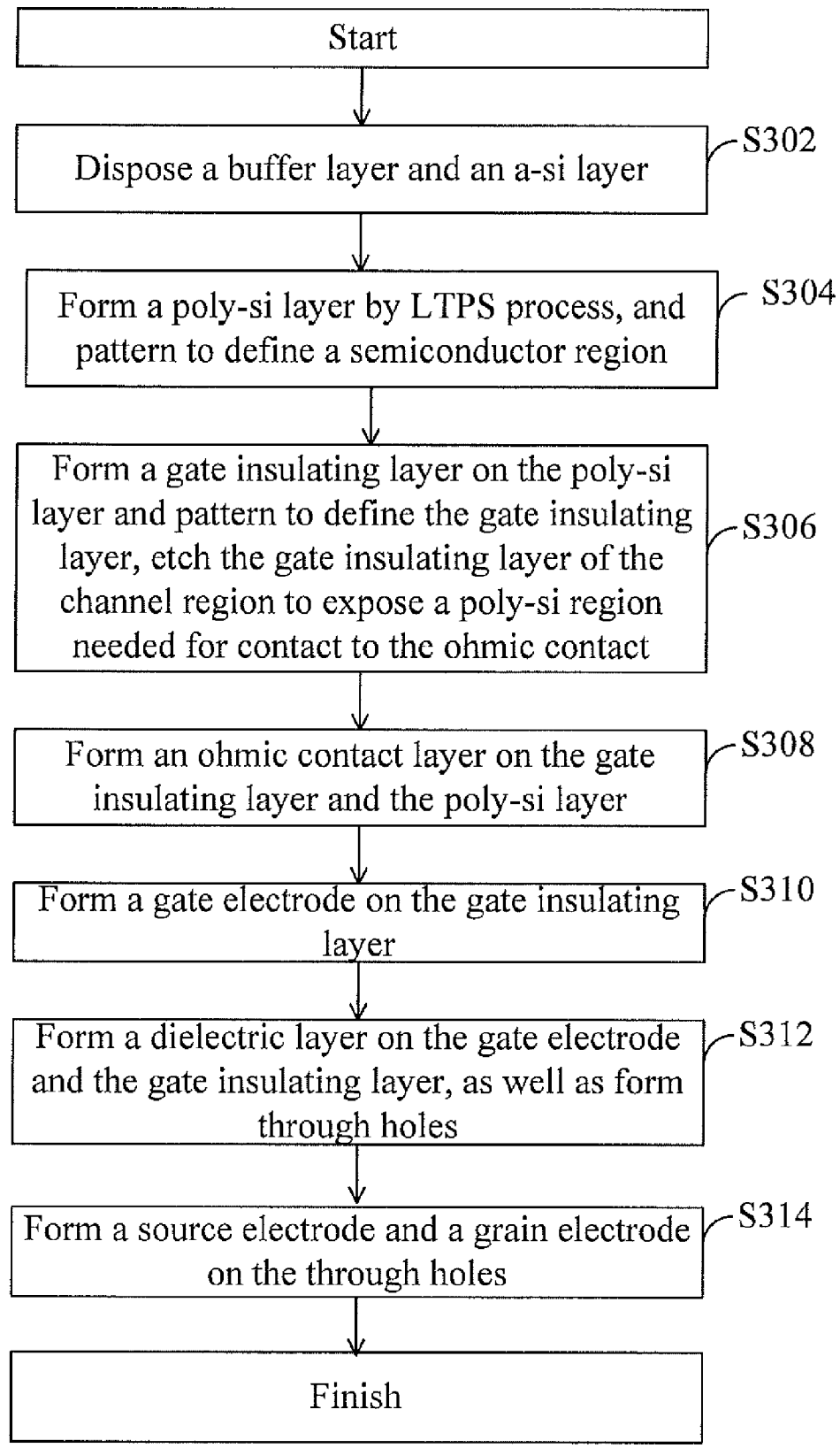
FIG. 3 is a flowchart of a method for fabricating a thin film transistor according to the first embodiment of the present invention.
Figure 4A:
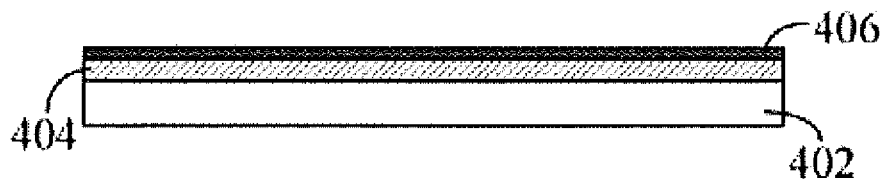
FIG. 4A~4G are schematic diagrams of a thin film transistor according to the first embodiment of the present invention.
Figure 4B:
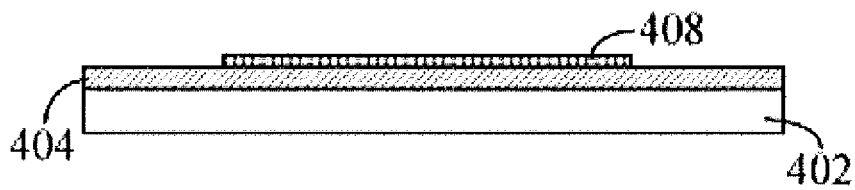

FIG. 3 is a flowchart of a method for fabricating a thin film transistor according to the first embodiment of the present invention. FIG. 4A~4G are schematic diagrams of a thin film transistor according to the first embodiment of the present invention. The flowchart of FIG. 3 is described below, along with FIG. 4A~4G. In step S302, a buffer layer 404 and an amorphous-silicon layer 406 are sequentially forming on a substrate 402, as shown in FIG. 4A. The buffer layer 404 and the amorphous-silicon layer 406 are formed on the substrate 402 by deposition. Then, in step S304, a poly-silicon layer 408 is formed by low temperature crystallization process, and patterned to define a semiconductor layer, as shown in FIG. 4B. The amorphous-silicon layer 406 is converted to the poly-silicon layer 408 by the low temperature crystallization process. The low temperature deposition process used in the present invention may be either a laser annealing or metal solid-phase crystallization, but not limited thereto.

Figure 4C:
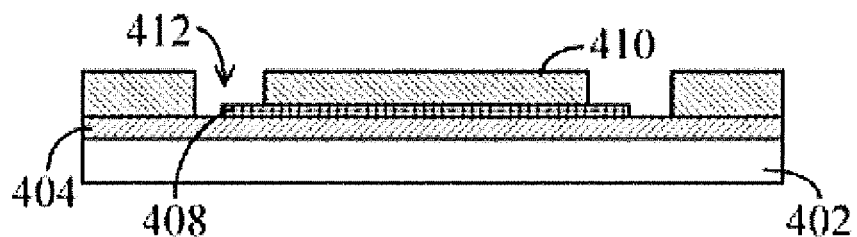
Figure 4D:
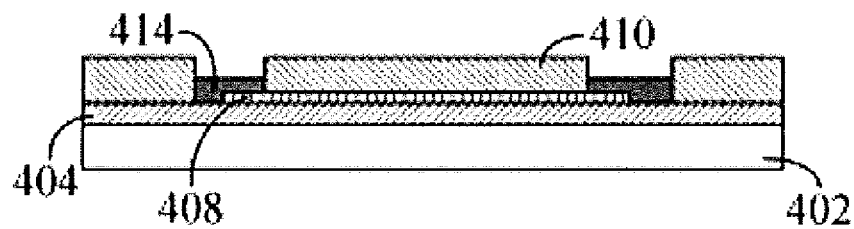
Figure 4E:
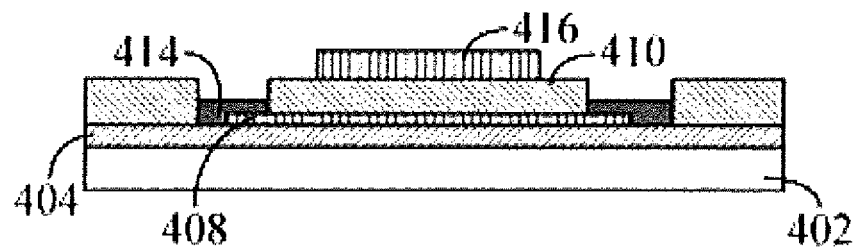

Further, in the other embodiments, the poly-silicon layer 408 may be formed directly on the buffer layer 404, which omits the step of the amorphous-silicon layer 406 is converted to the poly-silicon layer 408. Next, in step S306, a gate insulating layer 410 is formed on the poly-silicon layer 408, and patterned to define a gate insulating layer 410, and the gate insulating layer 410 of the channel region is etched by a dry etching manner to expose a region of the poly-silicon layer 408 needed for an ohmic contact, as shown in FIG. 4C. Then, in step S308, an ohmic contact layer 414 is formed on the gate insulating layer 410 and the poly-silicon layer 408, as shown in FIG. 4D. In this step, the ohmic contact layer 414 can be formed on the substrate 402 and then be patterned to define the ohmic contact layer 414, and an extra region is etched to reserve only the poly-silicon layer 408 contacted with the ohmic contact layer 414. Since the reserved ohmic contact layer 414 is disposed on the channel region 412 which is formed in step S306, the channel region 412 is first formed to prevent an over etching or insufficient etching problems of the ohmic contact layer. In step S310 of FIG. 4E, a gate electrode 416 is formed on the gate insulating layer 410.

Figure 4F:
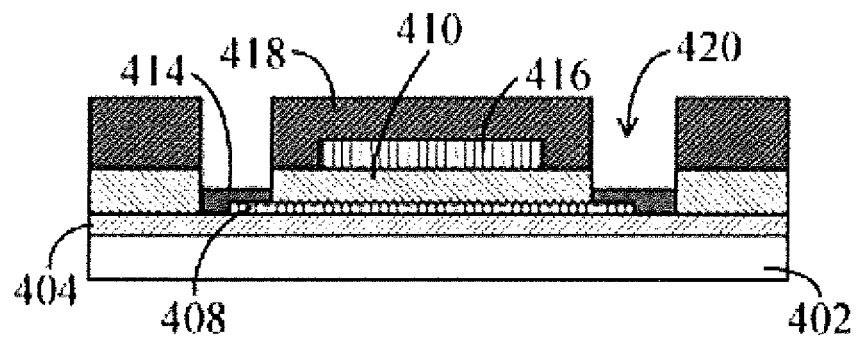
Figure 4G:
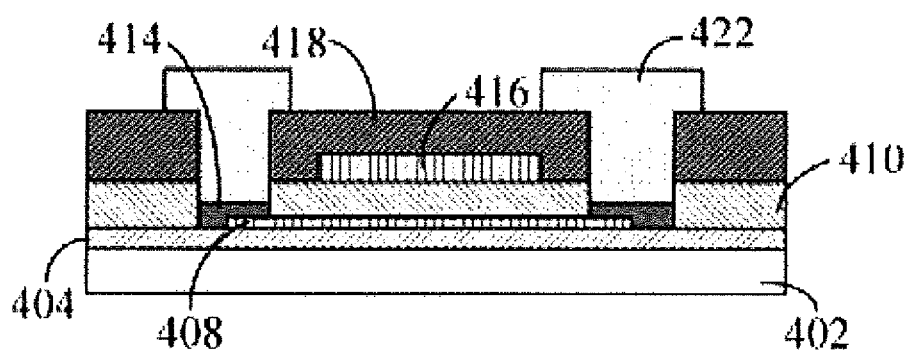

In step S312 of FIG. 4F, a dielectric layer 418 is formed on the gate insulating layer 416 and the gate electrode 410, and through holes 420 are formed as well. The through holes 420 are disposed on two sides of the gate electrode 416, and pass through the dielectric layer 418 and the gate insulating layer 416 to expose the ohmic contact layer 414. Finally, in step S314 of FIG. 4G, a source electrode and a drain electrode 422 are formed on the through holes 420, so as to complete the manufacturing process of the thin film transistor of the present invention. Because the ohmic contact layer 414 is formed in the channel of the gate insulating layer 410, the channel of the gate insulating layer 410 limits the region that can form the ohmic contact layer 414, such that the over etching to the poly-silicon layer 408 or an accumulation of the ohmic contact layer 414 problems will not occur, therefore, it enhances the uniformity of the thin film transistor.

Figure 5:
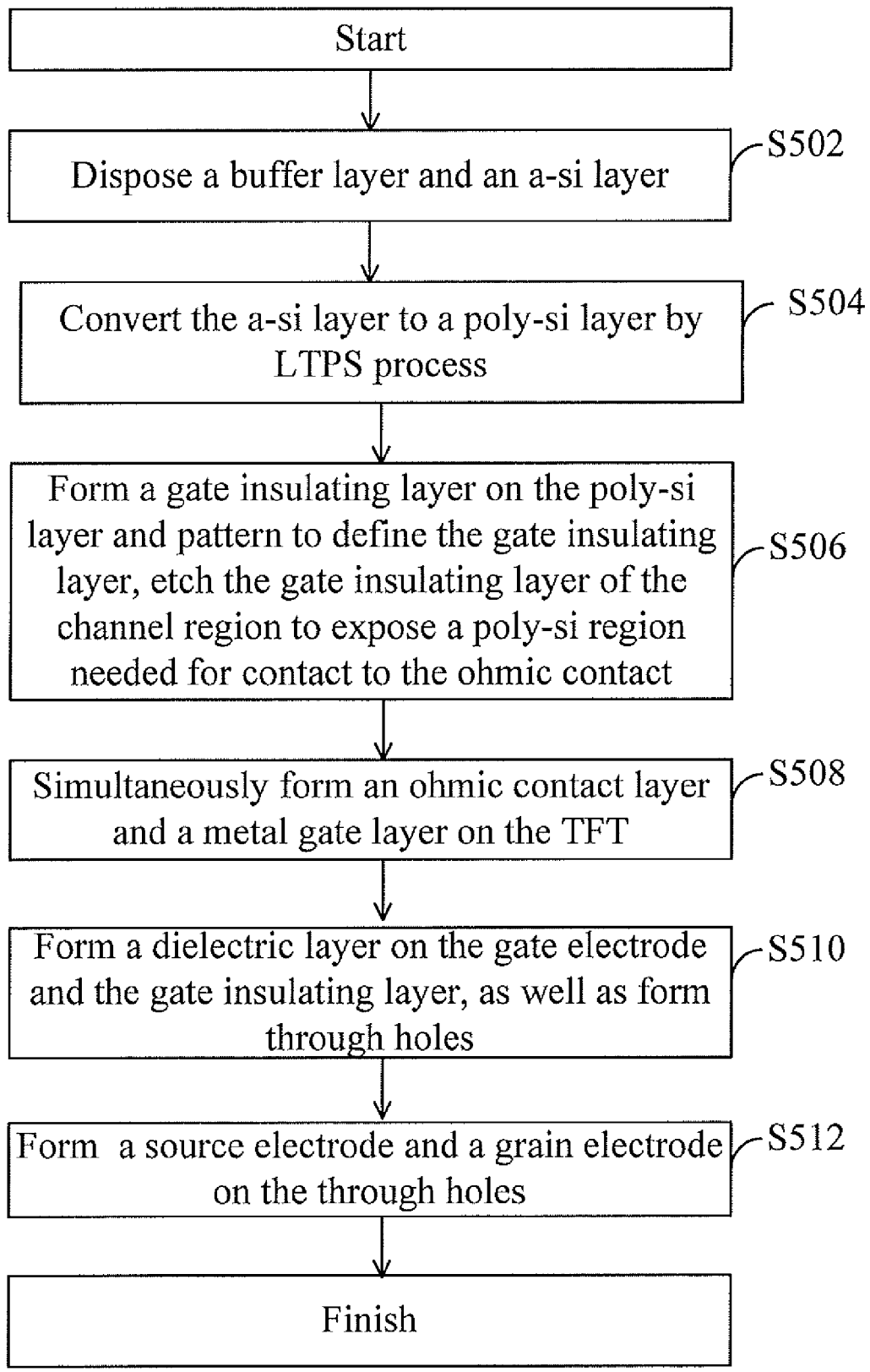
FIG. 5 is a flowchart of a method for fabricating a thin film transistor according to the second embodiment of the present invention.
Figure 6A:
FIG. 6A~6G are schematic diagrams of a thin film transistor according to the second embodiment of the present invention.
Figure 6B:
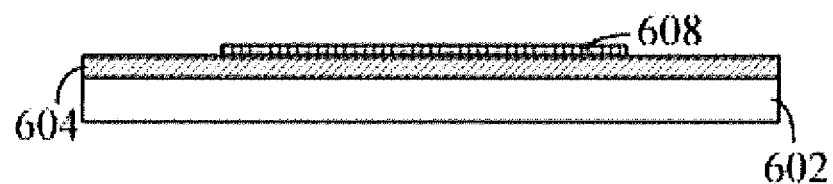
Figure 6C:
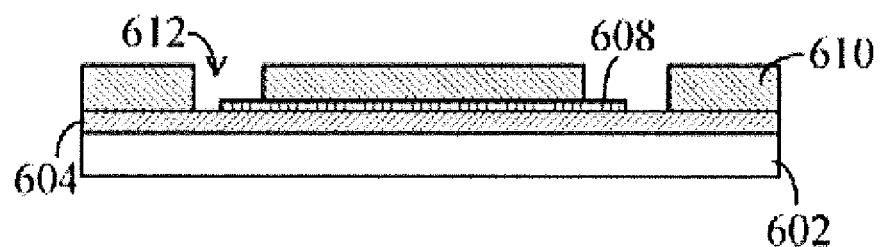
Figure 6D:
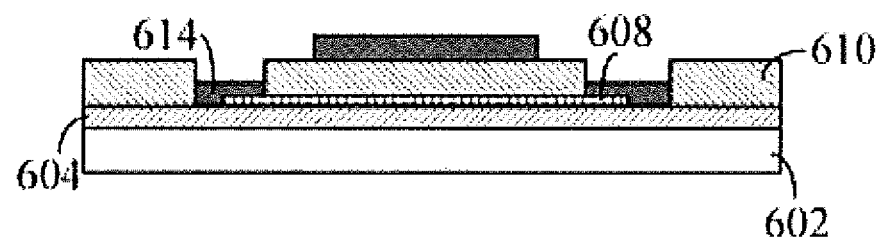
Figure 6E:
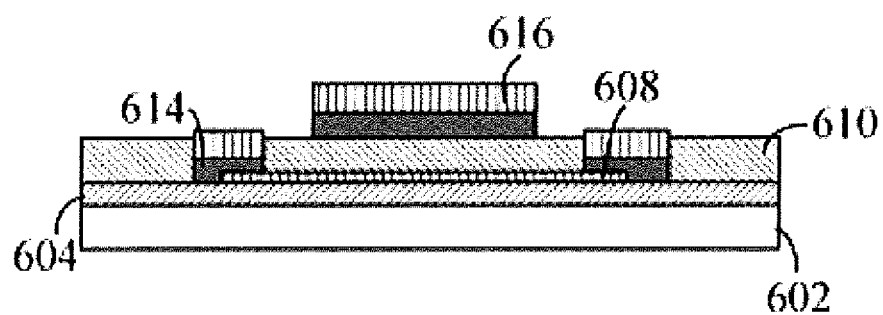
Figure 6F:
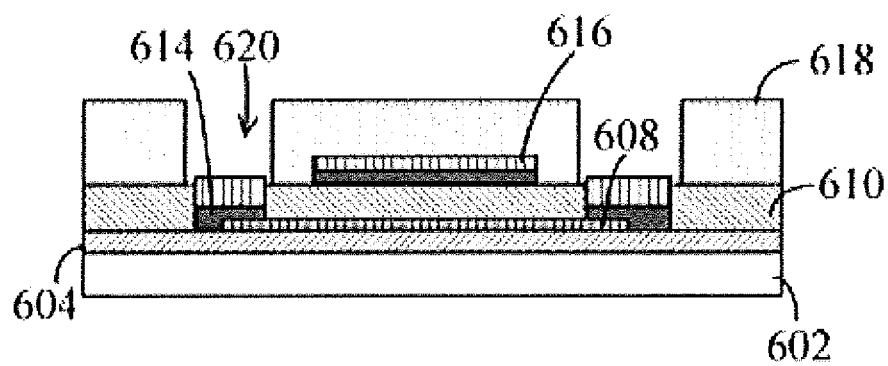

FIG. 5 is a flowchart of a method for fabricating a thin film transistor according to the second embodiment of the present invention. FIG. 6A~6G are schematic diagrams of a thin film transistor according to the second embodiment of the present invention. The flowchart of FIG. 5 is described below, along with FIG. 6A~6G. In step S502, a buffer layer 604 and an amorphous-silicon layer 606 are sequentially formed on a substrate 602, as shown in FIG. 6A. Next, in step S504 of FIG. 6B, the amorphous-silicon layer 606 is converted to a poly-silicon layer 608 by a low temperature crystallization process, and patterned to define a semiconductor region. The low temperature crystallization process converts the amorphous-silicon layer 606 to a poly-silicon structure to produce the poly-silicon layer 608. In step S506 of FIG. 6C, a gate insulating layer 610 is formed on the poly-silicon layer 608, and patterned to define a gate insulating layer 610, and the gate insulating layer 610 of the channel region 612 is etched by a thy etching manner to expose a region of the poly-silicon layer 608 needed for an ohmic contact. The gate insulating layer 610 is mainly composed of silicon nitride (SiNx) and silicon oxide (SiOx), the silicon nitride is etched by the dry etching manner, and then the silicon oxide is etched by a wet etching manner to expose the region of the poly-silicon layer 608 needed for an ohmic contact.

In addition, an etching solution of the present invention is a mixed liquid mainly composed of hydrogen fluoride (HF) and ammonium fluoride (NH4F). Then, in step S508 of FIG. 6D, an ohmic contact layer 614 and a metal gate layer 616 are simultaneously deposited on the thin film transistor, and then patterned to form the ohmic contact layer 614 and the metal gate layer 616, such that it can saves a manufacturing step of pattern the semiconductor. Similarly, by the thy etching manner and the wet etching manner, the extra region is etched to reserve only the ohmic contact layer 614 contacted with the poly-silicon layer 608. In the step S610 of FIG. 6E and FIG. 6F, a dielectric layer 618 is formed on the gate electrode 616 and the gate insulating layer 610, and through holes 620 are formed as well. The through holes 620 are disposed on two sides of the gate electrode 616, and pass through the dielectric layer 618 and the gate insulating layer 610 to expose the ohmic contact layer 614.

Figure 6G:
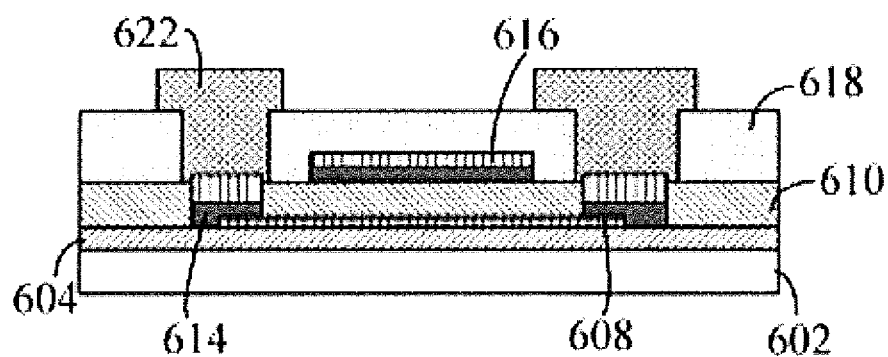

Finally, in step S512 of FIG. 6G, a source electrode and a drain electrode are formed on the through hole 620, so as to complete the thin film transistor of the second embodiment of the present invention. Similarly, since the ohmic contact layer 614 is formed in the gate insulating layer 610, the channel of the gate insulating layer 310 limits the region that can form the ohmic contact layer 614, such that the problems of over etching to the poly-silicon layer or insufficient etching of the ohmic contact layer in the conventional thin film transistor will not occur, therefore, it enhances the uniformity of the thin film transistor.

Through the above-described first embodiment and the second embodiment, the gate insulating layer is first formed to limit the available etching area of the ohmic contact layer, it can solve the problems of the over etching to the poly-silicon layer or the insufficient etching of the ohmic contact layer in the conventional art. The beneficial effect of the present invention is: to eliminate the short circuit problem caused by the over etching to the poly-silicon layer of the channel region or the accumulation of the ohmic contact layer due to the etching uniformity and accuracy during the process of etching the ohmic contact layer.

The embodiments were chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A method for fabricating a thin film transistor, the method comprising the steps of:
   sequentially forming a buffer layer and a poly-silicon layer;
   forming a gate insulating layer on the poly-silicon layer, and etching the gate insulating layer to expose the poly-silicon layer needed for an ohmic contact;
   forming an ohmic contact layer on the gate insulating layer and the poly-silicon layer, and etching an extra portion of the ohmic contact layer to reserve the ohmic contact layer contacted with the poly-silicon layer;
   forming a gate electrode on the gate insulating layer;
   forming a dielectric layer on the gate electrode and the gate insulating layer, as well as forming through holes; and
   forming a source electrode and a drain electrode on the through hole.

2. The method for fabricating a thin film transistor as claimed in claim 1, wherein in the step of sequentially forming a buffer layer and a poly-silicon layer, the buffer layer and an amorphous-silicon layer are sequentially deposited on the substrate of the thin film transistor, and then the amorphous-silicon layer is converted to the poly-silicon layer.

3. The method for fabricating a thin film transistor as claimed in claim 2, wherein in the step of the amorphous-silicon layer is converted to the poly-silicon layer is using either a laser annealing or a metal solid-phase crystallization to convert the amorphous-silicon layer to the poly-silicon layer having a poly-silicon structure.

4. The method for fabricating a thin film transistor as claimed in claim 1, wherein in the step of etching an extra portion of the ohmic contact layer to reserve the ohmic contact layer contacted with the poly-silicon layer, a channel region is first defined on the gate insulating layer, and the channel region of the gate insulating layer is etched to expose the poly-silicon layer needed for the ohmic contact.

5. The method for fabricating a thin film transistor as claimed in claim 1, wherein in the step of forming a gate insulating layer on the poly-silicon layer, the material of the gate insulating layer are silicon nitride and silicon oxide, the silicon nitride of the gate insulating layer is etched by a dry etching manner, and then the silicon oxide of the gate insulating layer is etched by a wet etching manner.

6. The method for fabricating a thin film transistor as claimed in claim 5, wherein in the step of the silicon oxide of the gate insulating layer is etched by a wet etching manner, an etching solution of the wet etching manner is selected from the group composing of hydrogen fluoride and ammonium fluoride.

7. A method for fabricating a thin film transistor, the method comprising the steps of:
    sequentially forming a buffer layer and an amorphous-silicon layer; converting the amorphous-silicon layer to a poly-silicon layer by a low temperature crystallization process;
    forming a gate insulating layer having a silicon nitride and a silicon oxide on the poly-silicon layer, a channel region is defined on the gate insulating layer, and the channel region of the gate insulating layer is etched to expose the poly-silicon layer needed for an ohmic contact;
    simultaneously depositing an ohmic contact layer and a metal gate layer on the gate insulating layer and the poly-silicon layer, and etching an extra region of the ohmic contact layer and the metal gate layer to reserve the ohmic contact layer;
    forming a gate electrode on the gate insulating layer;
    forming a dielectric layer on the gate electrode and the gate insulating layer, as well as forming through holes; and
    forming a source electrode and a drain electrode on the through holes.

8. The method for fabricating a thin film transistor as claimed in claim 7, wherein in the step of converting the amorphous-silicon layer to the poly-silicon layer is using either a laser annealing or a metal solid-phase crystallization to convert the amorphous-silicon layer to the poly-silicon layer having a poly-silicon structure.

9. The method for fabricating a thin film transistor as claimed in claim 7, wherein in the step of forming a gate insulating layer having a silicon nitride and a silicon oxide on the poly-silicon layer, the gate insulating layer having the silicon nitride is first etched by a dry etching manner, and then the gate insulating layer having the silicon oxide is etched by a wet etching manner.

10. The method for fabricating a thin film transistor as claimed in claim 9, wherein in the step of the gate insulating layer having the silicon oxide is etched by a wet etching manner, an etching solution of the wet etching manner is selected from the group composing of hydrogen fluoride and ammonium fluoride.

* * * * *